(12) United States Patent
Otsuki et al.

(10) Patent No.: US 10,297,429 B2
(45) Date of Patent: May 21, 2019

(54) HIGH-PURITY COPPER-CHROMIUM ALLOY SPUTTERING TARGET

(71) Applicant: JX Nippon Mining & Metals Corporation, Tokyo (JP)

(72) Inventors: Tomio Otsuki, Ibaraki (JP); Atsushi Fukushima, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 607 days.

(21) Appl. No.: 14/362,668

(22) PCT Filed: Jan. 21, 2013

(86) PCT No.: PCT/JP2013/051032
§ 371 (c)(1),
(2) Date: Jun. 4, 2014

(87) PCT Pub. No.: WO2013/111689
PCT Pub. Date: Aug. 1, 2013

(65) Prior Publication Data
US 2014/0360869 A1  Dec. 11, 2014

(30) Foreign Application Priority Data
Jan. 25, 2012  (JP) .................................. 2012-012944

(51) Int. Cl.
*C23C 14/34* (2006.01)
*H01J 37/34* (2006.01)
(Continued)

(52) U.S. Cl.
CPC ............ *H01J 37/3426* (2013.01); *C22C 1/02* (2013.01); *C22C 9/00* (2013.01); *C22F 1/08* (2013.01); *C23C 14/14* (2013.01); *C23C 14/3414* (2013.01)

(58) Field of Classification Search
CPC ............................. H01J 37/3426; C23C 14/14
See application file for complete search history.

(56) References Cited

U.S. PATENT DOCUMENTS 6,165,413 A    12/2000   Lo et al.
6,299,831 B1   10/2001   Lo
(Continued)

FOREIGN PATENT DOCUMENTS

JP    09324230 A1 * 12/1997
JP    H09-324230 A    12/1997
(Continued)

*Primary Examiner* — Jason Berman
(74) *Attorney, Agent, or Firm* — Howson & Howson LLP

(57) ABSTRACT

Provided is a high-purity copper-chromium alloy sputtering target comprising 0.1 to 10 wt % of Cr and the remainder being Cu and inevitable impurities, wherein when the number of precipitated Cr grains in a 100 μm square area is counted at different five areas randomly selected on the surface of the target, the difference between the largest and the smallest numbers of counted precipitated Cr grains is less than 40. The term "precipitated Cr grains" refers to the grains each having a Cr content of 70% or more and having a grain size of 1 to 20 μm. Thus, a thin film having excellent uniformity can be formed by adding an appropriate amount of a Cr element to copper and reducing the in-plane Cr variation of the sputtering target. In particular, the invention provides a high-purity copper-chromium alloy sputtering target that is useful for improving the yield and the reliability of semiconductor products, which have been progressing in miniaturization and integration.

7 Claims, 4 Drawing Sheets

Five 100 μm square areas are randomly designated, and the number of Cr grains (white dots in the photograph) precipitated in each area is counted.

(51) Int. Cl.
*C23C 14/14* (2006.01)
*C22C 9/00* (2006.01)
*C22C 1/02* (2006.01)
*C22F 1/08* (2006.01)

(56) References Cited

U.S. PATENT DOCUMENTS

| | | |
|---|---|---|
| 7,507,304 B2 | 3/2009 | Okabe et al. |
| 7,740,721 B2 | 6/2010 | Okabe |
| 8,246,764 B2 | 8/2012 | Okabe et al. |
| 2005/0121320 A1 | 6/2005 | Okabe et al. |
| 2007/0051624 A1 | 3/2007 | Okabe et al. |
| 2007/0240981 A1 | 10/2007 | Schlott et al. |
| 2009/0140430 A1 | 6/2009 | Okabe et al. |
| 2010/0000860 A1 | 1/2010 | Yuan et al. |
| 2010/0219070 A1 | 9/2010 | Okabe |
| 2011/0123389 A1* | 5/2011 | Shindo ................ C22C 9/00 420/499 |
| 2011/0163447 A1 | 7/2011 | Fukushima et al. |

FOREIGN PATENT DOCUMENTS

| | | |
|---|---|---|
| JP | 10-008244 A | 1/1998 |
| JP | 10324934 A1 * | 12/1998 |
| JP | H10-324934 A | 12/1998 |
| JP | 11-50242 A | 2/1999 |
| JP | 2002-129313 A | 5/2002 |
| JP | 2005-220384 A | 8/2005 |
| JP | 2006-73863 A | 3/2006 |
| JP | 2009-114539 A | 5/2009 |
| WO | 20061005095 A1 | 1/2006 |

* cited by examiner

[Fig. 1]
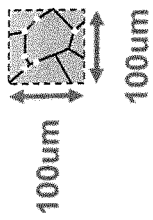
Five 100 μm square areas are randomly designated, and the number of Cr grains (white dots in the photograph) precipitated in each area is counted.

[Fig. 2]
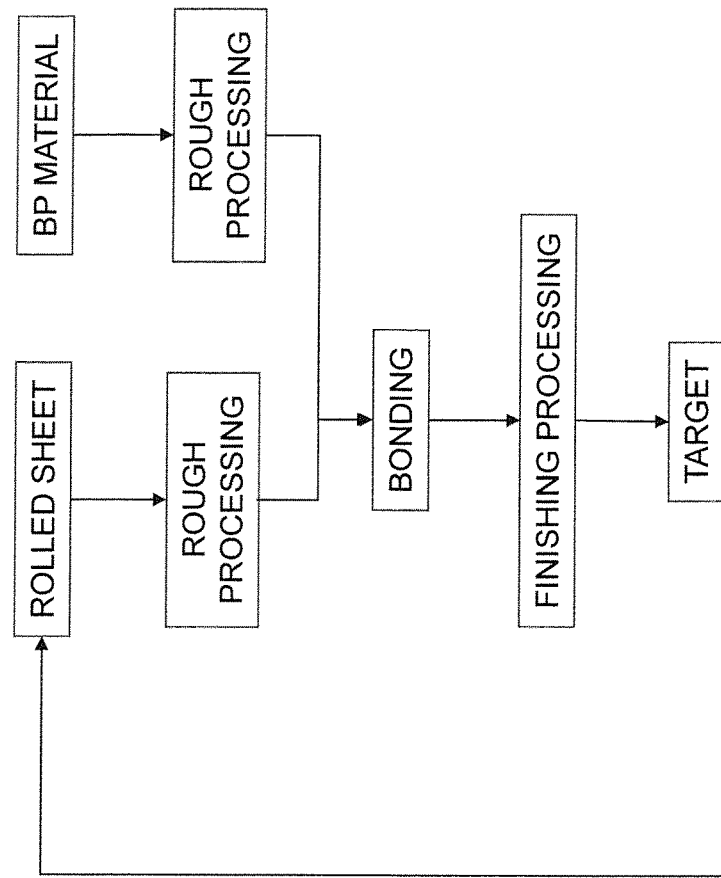
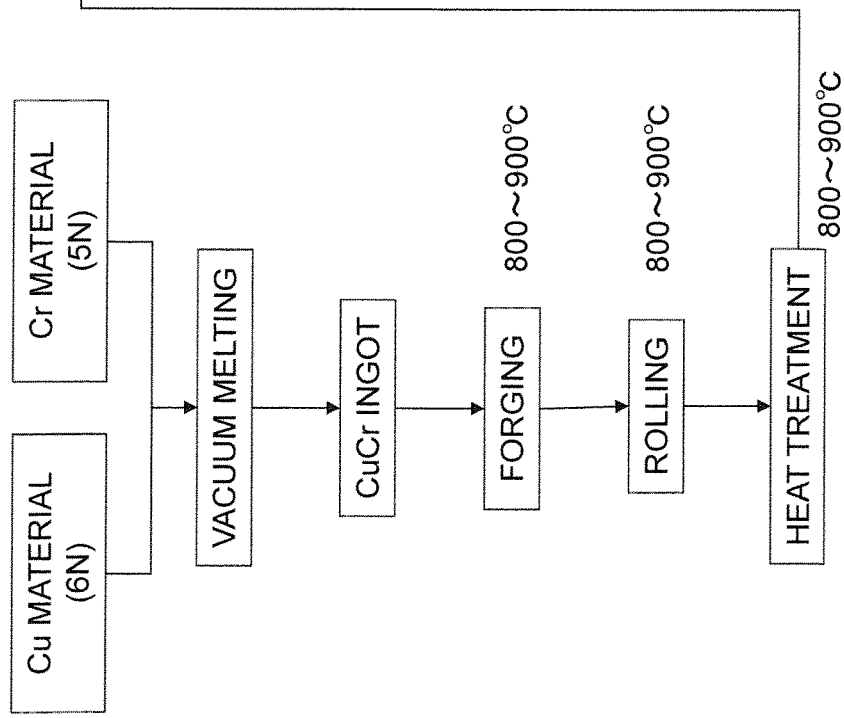

[Fig. 3]
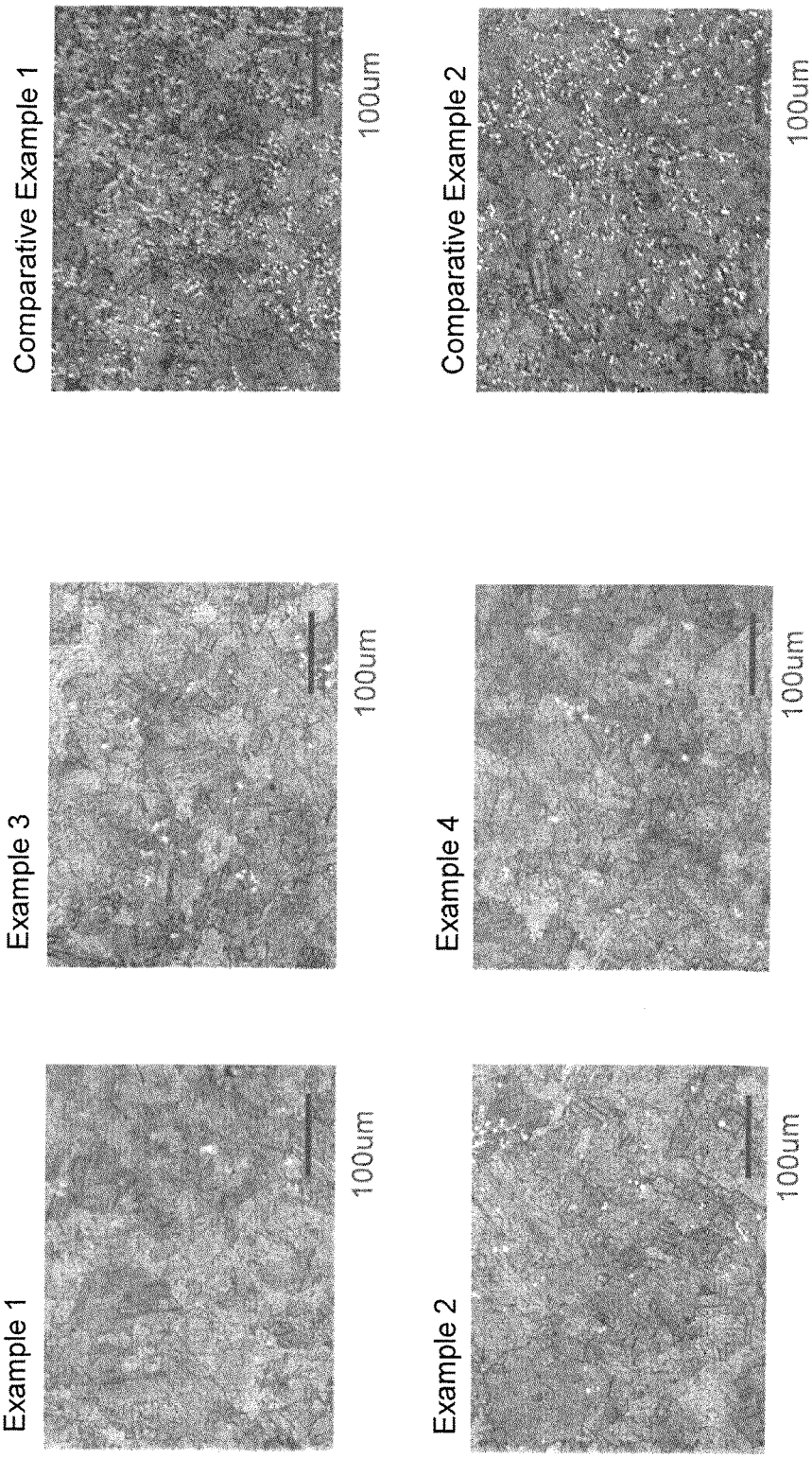

[Fig. 4]
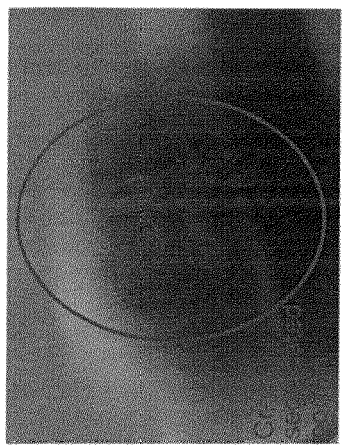
Comparative Example 1
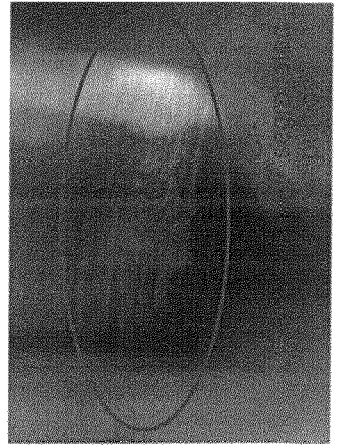
Comparative Example 2
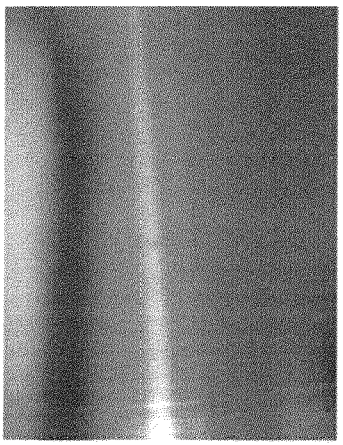
Example 3
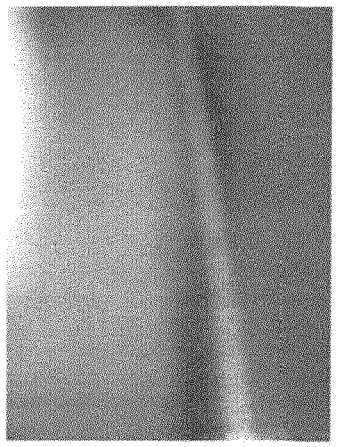
Example 4
Example 1
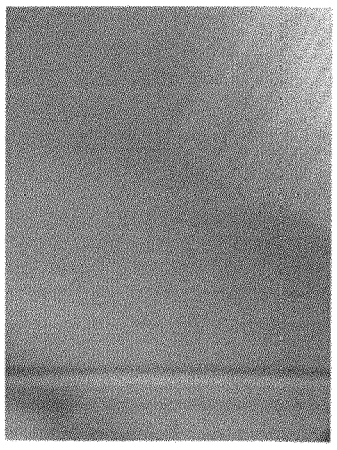
Example 2
Note: In Comparative Examples, unevenness due to segregation of Cr appeared on the processing surface.

HIGH-PURITY COPPER-CHROMIUM ALLOY SPUTTERING TARGET

BACKGROUND

The present invention relates to a high-purity copper-chromium alloy that is useful for forming semiconductor copper alloy wiring. In particular, the invention relates to a high-purity copper-chromium alloy sputtering target that allows formation of thin films having excellent uniformity.

Conventionally, Al alloys (specific resistance: about 3.0 $\mu\Omega\cdot$cm) were used as wiring materials of semiconductor devices. However, copper wiring having a lower resistance (specific resistance: about 2.0 $\mu\Omega\cdot$cm) has been put into practical use with miniaturization in wiring. Copper wiring is generally formed by forming a diffusion barrier layer of, for example, Ta or TaN in wiring or a wiring groove and then forming a film of copper by sputtering. Copper having a high purity of 5N to 6N is usually produced from electrolytic copper having a purity of about 4N (excluding gas components) as a crude metal by a wet or dry purification process, and the purified copper is used as a sputtering target.

As described above, copper is very effective for semiconductor wiring. However, copper itself is a very active metal and easily diffuses, and therefore causes a problem of contaminating a Si substrate or its periphery through the semiconductor Si substrate or the insulating film thereon. In particular, with progress in miniaturization of wiring, the problem cannot be sufficiently prevented by the conventional diffusion barrier layer of Ta or TaN only, and copper wiring materials themselves are also required to be improved. Accordingly, as copper wiring materials, copper alloys prepared by adding manganese (Mn) or chromium (Cr) to copper (Cu) and having a so-called self-diffusion suppression function (electromigration resistance) by self-forming a barrier layer through a reaction of Mn or Cr in the Cu alloys with oxygen in an insulating film have been proposed.

The semiconductor copper alloy wiring is formed using a copper-chromium alloy or copper-manganese alloy sputtering target. In such semiconductor copper alloy wiring, the in-plane variation in film thickness or sheet resistance of the wiring layer, which has not conventionally caused any problem, causes a problem of reducing the yield of chips (product) prepared from a wafer with progresses of miniaturization, density growth, and integration of semiconductor devices and with progresses of miniaturization and increase in number of wiring layers. Accordingly, there is a demand for a copper alloy sputtering target that can form a thick film (wiring) with less variation.

The present invention is focused on, in particular, a high-purity copper-chromium alloy sputtering target. Known related technologies are shown below.

Patent Document 1 describes a method of producing a low-oxygen high-density Cu/Cr sputtering target through: a stage of forming a powder mixture having a total oxygen content less than 900 ppm by mixing a Cu powder having a grain size controlled within a range of about 20 to 150 $\mu$m and a Cr powder having a grain size controlled within a range of about 20 to 150 $\mu$m; and a stage of compressing this powder mixture for at least about 1 hour such that the density is at least 90% of the theoretical density. Patent Document 1, however, does not have any description about the problems of Cr dispersibility and impurities.

Patent Document 2 describes a Cu-based sputtering target for forming electrode films, a method of producing the target, and a Cu-based electrode film. In the sputtering target, a phase of a transition metal element (e.g., Cr, Co, Mo, W, Fe, Nb, or V) that is not solid-soluted into a matrix mainly made of Cu is dispersed in the matrix. As an example, a Cu-10 at % Cr target is shown. Patent Document 2, however, does not have any description about the problems of Cr dispersibility and impurities.

Patent Document 3 describes a method of producing a high-density sputtering target composed of a Cr—Cu alloy that is a compressed target material such that a bulk density is 30% to 50% of the theoretical value and that a ratio of the radius to the thickness is 5 or more. Patent Document 3, however, does not have any description about the problems of Cr dispersibility and impurities.

Patent Document 4 describes a material for conductive wire produced from a copper alloy containing: Cu in an amount exceeding 90 at %; at least one element selected from the group consisting of Ca, Sr, Ba, Sc, Y, lanthanide, Cr, Ti, Zr, Hf, and Si in a total amount of 0.5 to 10 at %; and at least one element selected from the group consisting of Mg, V, Nb, Ta, Mo, W, Ag, Au, Fe, and B in a total amount of 0 to 5 at %. Patent Document 4, however, does not have any description about the problems of Cr dispersibility and impurities.

Patent Document 5 describes a copper sputtering target and a method of producing it. The copper sputtering target is composed of Cu and at least one alloy element selected from the group consisting of Al, Ag, Co, Cr, Ir, Fe, Mo, Ti, Pd, Ru, Ta, Sc, Hf, Zr, V, Nb, Y, and rare earth metals in a total amount of 0.001 to 10 wt %, and has a very small grain size and high electromigration resistance. Patent Document 5, however, does not have any description about the problem of Cr dispersibility.

Patent Document 6 describes a sputtering target for forming semiconductor copper alloy wiring, which is a semiconductor element wiring material proposed by the present applicant and is composed of Mn in an amount of 0.05 to 5 wt %, at least one element selected from Sb, Zr, Ti, Cr, Ag, Au, Cd, In, and As in a total amount of 10 wt ppm or less, and the remainder being Cu.

This is effective for enhancing the self-diffusion suppression function, but the purpose thereof is not a reduction in in-plane variation of the copper alloy thin film formed on a wafer.

Patent Document 7 describes a copper alloy sputtering target, a method of producing it, and semiconductor device wiring. The copper alloy sputtering target contains Al in an amount of 0.01 to less than 0.5 wt %, Mn in an amount of 0.25 wt ppm or less, and at least one element selected from Sb, Zr, Ti, Cr, Ag, Au, Cd, In, and As in a total amount of 1.0 wt ppm or less. Patent Document 7, however, does not have any description about the problem of Cr dispersibility.

Patent Document 8 describes a copper alloy sputtering target and semiconductor device wiring. The copper alloy sputtering target contains Al in an amount of 0.5 to 4.0 wt %, Si in an amount of 0.5 wt % or less or Sn in an amount of 0.5 to 4.0 wt %, Mn in an amount of 0.5 wt ppm or less, and at least one element selected from Sb, Zr, Ti, Cr, Ag, Au, Cd, In, and As in a total amount of 1.0 wt ppm or less. Patent Document 8, however, does not have any description about the problem of Cr dispersibility.

Patent Document 8 discloses a technology relating to semiconductor device wiring using a copper-chromium alloy, but there is no recognition about problems of chromium contained in the alloy. This point is common to all Patent Documents mentioned above.

Patent Document 1: JP 2001-073127 A

Patent Document 2: JP H11-50242 A

Patent Document 3: JP 4435386 B
Patent Document 4: JP 2008-506040 A
Patent Document 5: JP 2010-502841 A
Patent Document 6: JP 2006-73863 A
Patent Document 7: International Publication No. WO2004/083482
Patent Document 8: JP 2009-114539 A

SUMMARY OF INVENTION

It is an object of the present invention to form a thin film having excellent uniformity by adding an appropriate amount of a Cr element to copper and reducing the in-plane variation (segregation) of Cr of a sputtering target. This can improve the yield and the reliability of semiconductor products, which have been progressing in miniaturization and integration. In addition, the invention provides a high-purity copper-chromium alloy sputtering target useful for forming semiconductor copper alloy wiring having a self-diffusion suppression function, being capable of effectively preventing the periphery of the wiring from becoming contaminated by diffusion of active Cu, and having excellent, for example, electromigration (EM) resistance and corrosion resistance.

In order to solve the above-mentioned problems, the present invention provides:
1) a high-purity copper-chromium alloy sputtering target comprising 0.1 to 10 wt % of Cr and the remainder being Cu and inevitable impurities, wherein when the number of precipitated Cr grains in a 100 μm square area is counted at different five areas randomly selected on the surface of the target, the difference between the largest and the smallest numbers of counted precipitated Cr grains is less than 40; note, however, that the precipitated Cr grains to be counted shall mean the grains each having a Cr content of 70% or more and a grain size of 1 to 20 μm;
2) the high-purity copper-chromium alloy sputtering target according to 1), wherein the contents of Na and K are each 5 wt ppm or less and the contents of Fe, Al, and Mg are each 1 wt ppm or less;
3) the high-purity copper-chromium alloy sputtering target according to 1) or 2), wherein the contents of S and Cl are each 1 wt ppm or less;
4) the high-purity copper-chromium alloy sputtering target according to any one of 1) to 3), wherein the contents of C and O are each 10 wt ppm or less; and
5) the high-purity copper-chromium alloy sputtering target according to any one of 1) to 4), wherein the contents of U and Th are each 1 wt ppb or less.

The high-purity copper-chromium alloy sputtering target of the present invention can form a thin film having excellent uniformity in the thickness by adding an appropriate amount of a Cr element to copper and reducing the in-plane variation (segregation) of Cr of the sputtering target. As a result, the yield and the reliability of semiconductor products, which have been progressing in miniaturization and integration, can be improved. In addition, the sputtering target has a self-diffusion suppression function and has excellent effects of effectively preventing the periphery of the wiring from being contaminated by diffusion of active Cu and of enhancing, for example, electromigration (EM) resistance and corrosion resistance.

BRIEF DESCRIPTION OF DRAWINGS

FIG. 1 is a drawing explaining the principle of counting the number of precipitated Cr grains.

FIG. 2 is a chart showing a typical process of producing a high-purity copper-chromium alloy target.

FIG. 3 includes photographs of the surface structures of targets in Examples and Comparative Examples.

FIG. 4 includes drawings showing machining surfaces of targets in Examples and Comparative Examples.

DETAILED DESCRIPTION

In the present invention, the content of Cr in a high-purity copper-chromium alloy is desirably 0.1 wt % or more and 10 wt % or less. A content of Cr less than 0.1 wt % reduces the self-diffusion suppression function, whereas a content of Cr exceeding Cr 10 wt % increases the resistance and thereby disadvantageously reduces the performance in terms of semiconductor copper alloy wiring. A copper alloy containing 0.1 to 5 wt % of Cr is further preferred.

In addition, one of major specific characteristics of the high-purity copper-chromium alloy sputtering target of the present invention is that when the number of precipitated Cr grains in a 100 μm square area is counted at different five areas randomly selected on the surface of the target, the difference between the largest and the smallest numbers of counted precipitated Cr grains is less than 40. This is resulted from a significant reduction in segregation of Cr in the target. FIG. 1 shows a drawing explaining the principle of counting precipitated Cr grains.

The precipitated Cr grain to be counted refers to the grain having a Cr content of 70% or more and having a grain size of 1 to 20 μm. Some of precipitated Cr grains are formed as grains bound to surrounding Cu or oxygen. Among grains including such grains, the grains that cause a problem of segregation of Cr are those having a Cr content of 70% or more.

Even in such grains, a grain having a size of less than 1 μm does not cause a problem of segregation of Cr in the target. A grain having a size exceeding 20 μm directly causes segregation, and a target containing such grains is not included in the present invention. Accordingly, in the present invention, the form of the grains is as described above.

Furthermore, the contents of Na and K each being 5 wt ppm or less and the contents of U and Th each being 1 wt ppb or less are effective for preventing the peripheral materials (e.g., barrier material and base) of wiring from being contaminated when the wiring is formed and for preventing the device performance from being decreased. The contents of Fe, Al, and Mg each being 1 wt ppm or less, the contents of S and Cl each being 1 wt ppm or less, and the contents of C and O each being 10 wt ppm or less are effective for reducing the electrical resistance of a film formed by sputtering. The present invention encompasses such cases.

The in-plane variation (CV value) of the Vickers hardness on the target surface is desirably 15% or less, but which is an additional factor in the present invention. The CV value is calculated by the expression: [(standard deviation)/(mean value)]×100(%).

If the in-plane variation of the Vickers hardness on the target surface exceeds 15%, changes in film-forming rate and sputtering rate of Cr increase, which are undesirable in many cases. Accordingly, the in-plane variation of the Vickers hardness should be controlled to 15% or less. Incidentally, the mean value of the Vickers hardness is 60 to 95 Hv.

The sputtering target of the present invention can contain one or more elements selected from B, P, Mn, Ni, Sb, and As in a content of 0.1 wt ppm or more and 10 wt ppm or less. These additional elements enhance the uniformity of a crystal structure. A content of less than 0.1 wt ppm does not show the effect by addition, whereas a content exceeding 10 wt ppm disadvantageously increases the electrical resistance of a film formed by sputtering. Consequently, the amount of the additional elements is within the range mentioned above.

In the production of the high-purity copper-chromium alloy sputtering target in the present invention, high-purity copper having a purity of 6N or more and chromium, an additive element, having a purity of 5N or more are molten in a carbon crucible. Alternatively, high-purity copper having a purity of 6N or more is molten in a carbon crucible in advance, and chromium having a purity of 5N or more is then added thereto so as to give a desired component composition. FIG. 2 shows a typical process of the production.

The thus-prepared alloy is cast to give a high-purity copper-chromium alloy ingot containing 0.1 to 10 wt % of Cr. Subsequently, this copper-chromium alloy ingot is hot-forged at a predetermined forging ratio, followed by rolling at a predetermined rolling reduction to give a rolled sheet.

The rolled sheet is further heat-treated at a predetermined temperature for a predetermined period of time and is then thickness of 50 mm. The ingot was then hot-rolled (temperature: 800° C. to 900° C.) to give a thickness of 12 mm. Furthermore, the ingot was heat-treated (temperature: 800° C. to 900° C.) and was then water-cooled to give a target material. The target material was machined into a target having a diameter of 330 mm and a thickness of 7 mm.

Table 1 shows the Cr composition, heat treatment temperature, cooling condition, and other data. The heat treatment temperature shown in Table 1 refers to the temperature of heat treatment after the hot rolling, and the cooling condition refers to the condition for cooling to room temperature after the completion of the heat treatment at a predetermined holding temperature for a predetermined time after the hot-rolling.

The air-cooling in Table 1 means cooling in the air, and the water-cooling means cooling with water at ordinary temperature. As the temperature in the air or the temperature of water, a reasonable temperature range of about 0° C. to 35° C. is intended. However, even if the temperature is out of this range, since there is a large difference between water-cooling and air-cooling, such temperature does not cause any problem.

TABLE 1

| | Cr composition | Heat treatment temperature | Cooling condition | Variation in number of precipitated Cr grains [(largest number) − (smallest number)] | Particles (maximum number) | Film resistance distribution (maximum uniformity value) |
|---|---|---|---|---|---|---|
| Example 1 | 0.27 wt % | 800~900° C. | water-cooling | 2 | 28 | 4.1% |
| Example 2 | 10 wt % | 800~900° C. | water-cooling | 27 | 41 | 3.6% |
| Example 3 | 0.1 wt % | 800~900° C. | water-cooling | 7 | 26 | 3.4% |
| Example 4 | 5.0 wt % | 800~900° C. | water-cooling | 16 | 34 | 3.7% |
| Comparative Example 1 | 0.9 wt % | 800~900° C. | air-cooling | 60 | 152 | 9.2% |
| Comparative Example 2 | 12 wt % | 800~900° C. | air-cooling | 53 | 113 | 8.3% | bonded to a backing plate, followed by finishing processing. Thus, a sputtering target assembly is produced from the high-purity copper-chromium alloy.

EXAMPLES

The present invention will now be described based on Examples. The following Examples are intended to facilitate understanding and do not limit the present invention. That is, modifications and other examples based on the technical idea of the present invention are included in the present invention.

Example 1

In Example 1, 35 kg of high-purity copper (Cu) having a purity of 6N was melted (melting temperature: 1100° C. or more) in a carbon crucible under a high vacuum atmosphere. High-purity chromium (Cr) having a purity of 5N was prepared and was charged into the molten copper. The amount of Cr was adjusted to 0.27 wt %.

The molten copper-chromium alloy prepared by charging and melting of the Cr was cast in a water-cooled copper mold under a high vacuum atmosphere to give an ingot (diameter: 174 mm, thickness: 113 mm).

Subsequently, the surface layer of the produced ingot was removed, followed by forging (temperature: 800° C. to 900° C.) to give an ingot having a diameter of 262 mm and a The numbers of precipitated Cr grains in the target of Example 1 were counted by the procedure shown in FIG. 1. The result is shown in Table 1. As shown in Table 1, the variation in the number of precipitated Cr grains (difference between the largest and the smallest numbers) was 2. A photograph of the structure of the target surface is shown in FIG. 3, and a polished surface of the target is shown in FIG. 4. It can be observed that the number of Cr grains on the target surface is small. In addition, the photograph of the appearance of the surface shows that no "unevenness" due to segregation of Cr was caused on the processing surface to give satisfactory results.

Subsequently, the film quality of a thin film formed by sputtering was evaluated by forming a thin film with a thickness of 600 nm by sputtering the target of Example 1 on a 300-mm monocrystalline silicon wafer covered with silicon oxide under sputtering conditions shown below and measuring the number of particles (maximum number) and the sheet resistance levels of the resulting thin film to calculate the uniformity in film thickness. The result is also shown in Table 1. The uniformity was determined by measuring the sheet resistance levels at randomly selected 49 points of the thin film formed on the wafer and calculating from the mean value and the standard deviation by the expression: [(standard deviation of sheet resistance levels at 49 points)/(mean value of the sheet resistance levels at 49 points)×100(%)].

(Sputtering Conditions)

Apparatus: Endura manufactured by Applied Materials, Inc.
Power source: direct current system
Power: 40 kW
Ultimate vacuum: $5 \times 10^{-6}$ Pa
Atmospheric gas composition: Ar
Sputtering gas pressure: 55 Pa
Sputtering time: 6 seconds As shown in Table 1, in Example 1, the number of particles was 28 (maximum number), and the thickness uniformity (film resistance distribution) of the thin film formed using the target was 4.1%. The satisfactory thickness uniformity was obtained even if the sputtering was continued for a long time. The evaluation of particles was performed by forming a film on a wafer by sputtering the target and counting the number of particles having a size of 0.2 μm or more on the wafer with Surfscan manufactured by KLA-Tencor Corporation.

The analytical data of the target in Example 1 is shown in Table 2. As obvious from Table 2, it was confirmed that the amount of impurities was small and that a high-purity copper-chromium alloy target was given.

Example 2

In Example 2, as in Example 1, 35 kg of high-purity copper (Cu) having a purity of 6N was melted (melting temperature: 1100° C. or more) in a carbon crucible under a high vacuum atmosphere. High-purity chromium (Cr) having a purity of 5N was prepared and was charged into the molten copper. The amount of Cr was adjusted to 10 wt %.

The molten copper-chromium alloy prepared by charging and melting of the Cr was cast in a water-cooled copper mold under a high vacuum atmosphere to give an ingot (diameter: 174 mm, thickness: 113 mm).

Subsequently, the surface layer of the produced ingot was removed, followed by forging (temperature: 800° C. to 900° C.) to give an ingot having a diameter of 262 mm and a thickness of 50 mm. The ingot was then hot-rolled (temperature: 800° C. to 900° C.) to give a thickness of 12 mm. Furthermore, the ingot was heat-treated (temperature: 800° C. to 900° C.) and was then water-cooled to give a target material. The target material was machined into a target having a diameter of 330 mm and a thickness of 7 mm. The Cr composition, heat treatment temperature, cooling condition, and other data are shown in Table 1.

TABLE 2

|  | Example 1 | Example 2 | Example 3 | Example 4 | Comparative Example 1 | Comparative Example 2 |
| --- | --- | --- | --- | --- | --- | --- |
| Li | <0.01 | <0.01 | <0.01 | <0.01 | <0.01 | <0.01 |
| Be | <0.01 | <0.01 | <0.01 | <0.01 | <0.01 | <0.01 |
| B | 0.007 | 0.01 | 0.005 | 0.008 | 0.09 | 0.008 |
| F | <0.01 | <0.01 | <0.01 | <0.01 | <0.01 | <0.01 |
| Na | <0.01 | 0.01 | <0.01 | <0.01 | <0.01 | <0.01 |
| Mg | 0.11 | 1.2 | 0.2 | 0.8 | 0.5 | 1.6 |
| Al | 0.02 | 0.09 | 0.03 | 0.04 | 0.01 | 0.03 |
| Si | 0.22 | 1.1 | 0.31 | 0.74 | 0.9 | 1.4 |
| P | 0.03 | 0.03 | 0.02 | 0.05 | 0.04 | 0.02 |
| S | 0.087 | 0.34 | 0.053 | 0.09 | 0.04 | 0.15 |
| Cl | 0.03 | 0.1 | 0.02 | 0.03 | 0.02 | 0.05 |
| K | <0.01 | <0.01 | <0.01 | <0.01 | <0.01 | <0.01 |
| Ca | <0.01 | 0.02 | <0.01 | <0.01 | <0.01 | 0.01 |
| Sc | <0.05 | <0.05 | <0.05 | <0.05 | <0.05 | <0.05 |
| Ti | 0.002 | 0.01 | 0.004 | 0.005 | 0.003 | 0.003 |
| V | 0.014 | 0.25 | 0.032 | 0.099 | 0.05 | 0.4 |
| Cr | Matrix | Matrix | Matrix | Matrix | Matrix | Matrix |
| Mn | 0.033 | 0.06 | 0.04 | 0.04 | 0.02 | 0.028 |
| Fe | 0.38 | 0.95 | 0.28 | 0.51 | 0.42 | 0..51 |
| Co | 0.017 | 0.04 | 0.042 | 0.033 | 0.032 | 0.054 |
| Ni | 0.064 | 0.07 | 0.032 | 0.051 | 0.042 | 0.053 |
| Cu | Matrix | Matrix | Matrix | Matrix | Matrix | Matrix |
| Zn | <0.01 | 0.01 | <0.01 | <0.01 | <0.01 | 0.02 |
| Ga | <0.01 | <0.01 | <0.01 | <0.01 | <0.01 | <0.01 |
| Ge | <0.1 | <0.1 | <0.1 | <0.1 | <0.1 | <0.1 |
| As | 0.065 | 0.01 | 0.043 | 0.076 | 0.05 | 0.03 |
| Zr | 0.021 | 0.06 | 0.034 | 0.045 | 0.015 | 0.03 |
| Nb | <1 | <1 | <1 | <1 | <1 | <1 |
| Mo | <0.005 | 0.08 | <0.005 | <0.005 | <0.005 | <0.005 |
| Pd | <0.5 | <0.5 | <0.5 | <0.5 | <0.5 | <0.5 |
| Ag | 0.17 | 0.15 | 0.15 | 0.2 | 0.19 | 0.1 |
| Cd | <0.01 | <0.01 | <0.01 | <0.01 | <0.01 | <0.01 |
| In | <0.005 | <0.005 | <0.005 | <0.005 | <0.005 | <0.005 |
| Sn | <0.01 | <0.01 | <0.01 | <0.01 | <0.01 | <0.01 |
| Sb | 0.4 | 0.04 | 0.13 | 0.05 | 0.03 | 0.02 |
| Ta | <5 | <5 | <5 | <5 | <5 | <5 |
| W | <0.005 | 0.02 | <0.005 | <0.005 | <0.005 | 0.01 |
| Pb | 0.007 | 0.1 | 0.006 | 0.007 | 0.005 | 0.08 |
| Bi | <0.001 | 0.009 | <0.001 | <0.001 | <0.001 | <0.001 |
| Th | <0.0001 | <0.0001 | <0.0001 | <0.0001 | <0.0001 | <0.0001 |
| U | <0.0001 | <0.0001 | <0.0001 | <0.0001 | <0.0001 | <0.0001 |
| H | <10 | <10 | <10 | <10 | <10 | <10 |
| C | <10 | <10 | <10 | <10 | <10 | <10 |
| N | <10 | <10 | <10 | <10 | <10 | <10 |
| O | <10 | 10 | <10 | <10 | <10 | <10 |
| Cr ratio | 0.27 wt % | 10 wt % | 0.1 wt % | 5.0 wt % | 0.9 wt % | 12.0 wt % |

The numbers of precipitated Cr grains in the target of Example 2 were counted by the procedure shown in FIG. 1. The result is also shown in Table 1. As shown in Table 1, the variation in the number of precipitated Cr grains (difference between the highest number and the lowest number) was 27. A photograph of the structure of the target surface is shown in FIG. 3, and a polished surface of the target is shown in FIG. 4. It can be observed that the number of Cr grains on the target surface is larger than that in Example 1, but is significantly smaller than those in Comparative Examples shown below. In addition, the photograph of the appearance of the surface shows that no "unevenness" due to segregation of Cr was caused on the processing surface to give satisfactory results.

Subsequently, the film quality of a thin film formed by sputtering was evaluated by forming a thin film with a thickness of 600 nm by sputtering the target of Example 2 on a 300-mm monocrystalline silicon wafer covered with silicon oxide under the same sputtering conditions as in Example 1 and measuring the number of particles (maximum number) and the sheet resistance levels of the resulting thin film to calculate the uniformity in film thickness. The result is also shown in Table 1. The uniformity was determined by measuring the sheet resistance levels at randomly selected 49 points of the thin film formed on the wafer and calculating from the mean value and the standard deviation by the expression: [(standard deviation of sheet resistance levels at 49 points)/(mean value of the sheet resistance levels at 49 points)×100(%)].

As shown in Table 1, in Example 2, the number of particles was 41 (maximum number), and the thickness uniformity (film resistance distribution) of the thin film formed using the target was 3.6%. The satisfactory thickness uniformity was obtained even if the sputtering was continued for a long time.

The analytical data of the target in Example 2 is shown in Table 2. As obvious from Table 2, it was confirmed that the amount of impurities was small and that a high-purity copper-chromium alloy target was given.

Example 3

In Example 3, as in Example 1, 35 kg of high-purity copper (Cu) having a purity of 6N was melted (melting temperature: 1100° C. or more) in a carbon crucible under a high vacuum atmosphere. High-purity chromium (Cr) having a purity of 5N was prepared and was charged into the molten copper. The amount of Cr was adjusted to 0.1 wt %.

The molten copper-chromium alloy prepared by charging and melting of the Cr was cast in a water-cooled copper mold under a high vacuum atmosphere to give an ingot (diameter: 174 mm, thickness: 113 mm).

Subsequently, the surface layer of the produced ingot was removed, followed by forging (temperature: 800° C. to 900° C.) to give an ingot having a diameter of 262 mm and a thickness of 50 mm. The ingot was then hot-rolled (temperature: 800° C. to 900° C.) to give a thickness of 12 mm. Furthermore, the ingot was heat-treated (temperature: 800° C. to 900° C.) and was then water-cooled to give a target material. The target material was machined into a target having a diameter of 330 mm and a thickness of 7 mm. The Cr composition, heat treatment temperature, cooling condition, and other data are shown in Table 1.

The numbers of precipitated Cr grains in the target of Example 3 were counted by the procedure shown in FIG. 1. The result is also shown in Table 1. As shown in Table 1, the variation in the number of precipitated Cr grains (difference between the largest and the smallest numbers) was 7. A photograph of the structure of the target surface is shown in FIG. 3, and a polished surface of the target is shown in FIG. 4. It can be observed that the number of Cr grains on the target surface is slightly larger than that in Example 1, but is significantly smaller than those in Comparative Examples shown below. In addition, the photograph of the appearance of the surface shows that no "unevenness" due to segregation of Cr was caused on the processing surface to give satisfactory results.

Subsequently, the film quality of a thin film formed by sputtering was evaluated by forming a thin film with a thickness of 600 nm by sputtering the target of Example 3 on a 300-mm monocrystalline silicon wafer covered with silicon oxide under the same sputtering conditions as in Example 1 and measuring the number of particles (maximum number) and the sheet resistance levels of the resulting thin film to calculate the uniformity in film thickness. The result is also shown in Table 1. The uniformity was determined by measuring the sheet resistance levels at randomly selected 49 points of the thin film formed on the wafer and calculating from the mean value and the standard deviation by the expression: [(standard deviation of sheet resistance levels at 49 points)/(mean value of the sheet resistance levels at 49 points)×100(%)].

As shown in Table 1, in Example 3, the number of particles was 26 (maximum number), and the thickness uniformity (film resistance distribution) of the thin film formed using the target was 3.4%. The satisfactory thickness uniformity was obtained even if the sputtering was continued for a long time.

The analytical data of the target in Example 3 is shown in Table 2. As obvious from Table 2, it was confirmed that the amount of impurities was small and that a high-purity copper-chromium alloy target was given.

Example 4

In Example 4, as in Example 1, 35 kg of high-purity copper (Cu) having a purity of 6N was melted (melting temperature: 1100° C. or more) in a carbon crucible under a high vacuum atmosphere. High-purity chromium (Cr) having a purity of 5N was prepared and was charged into the molten copper. The amount of Cr was adjusted to 5.0 wt %.

The molten copper-chromium alloy prepared by charging and melting of the Cr was cast in a water-cooled copper mold under a high vacuum atmosphere to give an ingot (diameter: 174 mm, thickness: 113 mm).

Subsequently, the surface layer of the produced ingot was removed, followed by forging (temperature: 800° C. to 900° C.) to give an ingot having a diameter of 262 mm and a thickness of 50 mm. The ingot was then hot-rolled (temperature: 800° C. to 900° C.) to give a thickness of 12 mm. Furthermore, the ingot was heat-treated (temperature: 800° C. to 900° C.) and was then water-cooled to give a target material. The target material was machined into a target having a diameter of 330 mm and a thickness of 7 mm. The Cr composition, heat treatment temperature, cooling condition, and other data are shown in Table 1.

The numbers of precipitated Cr grains in the target of Example 4 were counted by the procedure shown in FIG. 1. The result is also shown in Table 1. As shown in Table 1, the variation in the number of precipitated Cr grains (difference between the largest and the smallest numbers) was 16. A photograph of the structure of the target surface is shown in FIG. 3, and a polished surface of the target is shown in FIG. 4. It can be observed that the number of Cr grains on the target surface is slightly larger than that in Example 1, but is significantly smaller than those in Comparative Examples shown below. In addition, the photograph of the appearance of the surface shows that no "unevenness" due to segregation of Cr was caused on the processing surface to give satisfactory results.

Subsequently, the film quality of a thin film formed by sputtering was evaluated by forming a thin film with a thickness of 600 nm by sputtering the target of Example 4 on a 300-mm monocrystalline silicon wafer covered with silicon oxide under the same sputtering conditions as in Example 1 and measuring the number of particles (maximum number) and the sheet resistance levels of the resulting thin film to calculate the uniformity in film thickness. The result is also shown in Table 1. The uniformity was determined by measuring the sheet resistance levels at randomly selected 49 points of the thin film formed on the wafer and calculating from the mean value and the standard deviation by the expression: [(standard deviation of sheet resistance levels at 49 points)/(mean value of the sheet resistance levels at 49 points)×100(%)].

As shown in Table 1, in Example 4, the number of particles was 34 (maximum number), and the thickness uniformity (film resistance distribution) of the thin film formed using the target was 3.7%. The satisfactory thickness uniformity was obtained even if the sputtering was continued for a long time.

The analytical data of the target in Example 4 is shown in Table 2. As obvious from Table 2, it was confirmed that the amount of impurities was small and that a high-purity copper-chromium alloy target was given.

Comparative Example 1

In Comparative Example 1, as in Example 1, 35 kg of high-purity copper (Cu) having a purity of 6N was melted (melting temperature: 1100° C. or more) in a carbon crucible under a high vacuum atmosphere. High-purity chromium (Cr) having a purity of 5N was prepared and was charged into the molten copper. The amount of Cr was adjusted to 0.9 wt %, which is an amount of Cr within the range of the present invention.

The molten copper-chromium alloy prepared by charging and melting of the Cr was cast in a water-cooled copper mold under a high vacuum atmosphere to give an ingot (diameter: 174 mm, thickness: 113 mm).

Subsequently, the surface layer of the produced ingot was removed, followed by forging (temperature: 800° C. to 900° C.) to give an ingot having a diameter of 262 mm and a thickness of 50 mm. The ingot was then hot-rolled (temperature: 800° C. to 900° C.) to give a thickness of 12 mm. Furthermore, the ingot was heat-treated (temperature: 800° C. to 900° C.) and was then water-cooled to give a target material. The target material was machined into a target having a diameter of 330 mm and a thickness of 7 mm. The Cr composition, heat treatment temperature, cooling condition, and other data are shown in Table 1. In Comparative Example 1, air-cooling was employed.

The number of precipitated Cr grains in the target of Comparative Example 1 was counted by the procedure shown in FIG. 1. The result is also shown in Table 1. As shown in Table 1, the variation in the number of precipitated Cr grains (difference between the largest and the smallest numbers) was increased to 60. A photograph of the structure of the target surface is shown in FIG. 3, and a polished surface of the target is shown in FIG. 4. It can be observed that the number of Cr grains on the target surface significantly increased compared to those in Examples. In addition, the photograph of the appearance of the surface shows that "unevenness" due to segregation of Cr was caused on the processing surface. Thus, both results were poor.

Subsequently, the film quality of a thin film formed by sputtering was evaluated by forming a thin film with a thickness of 600 nm by sputtering the target of Comparative Example 1 on a 300-mm monocrystalline silicon wafer covered with silicon oxide under the same sputtering conditions as in Example 1 and measuring the number of particles (maximum number) and the sheet resistance levels of the resulting thin film to calculate the uniformity in film thickness. The result is also shown in Table 1. The uniformity was determined by measuring the sheet resistance levels at randomly selected 49 points of the thin film formed on the wafer and calculating from the mean value and the standard deviation by the expression: [(standard deviation of sheet resistance levels at 49 points)/(mean value of the sheet resistance levels at 49 points)×100(%)].

As shown in Table 1, in Comparative Example 1, the number of particles was significantly increased to 152 (maximum number), and the thickness uniformity (film resistance distribution) of the thin film formed using the target was 9.2%. The thickness uniformity was poor.

The analytical data of the target in Comparative Example 1 is shown in Table 2. As obvious from Table 2, a copper-chromium alloy target containing a large amount of impurities was given.

Comparative Example 2

In Comparative Example 2, as in Example 1, 35 kg of high-purity copper (Cu) having a purity of 6N was melted (melting temperature: 1100° C. or more) in a carbon crucible under a high vacuum atmosphere. High-purity chromium (Cr) having a purity of 5N was prepared and was charged into the molten copper. The amount of Cr was adjusted to 12 wt %, which is an amount of Cr out of the range of the present invention.

The molten copper-chromium alloy prepared by charging and melting of the Cr was cast in a water-cooled copper mold under a high vacuum atmosphere to give an ingot (diameter: 174 mm, thickness: 113 mm).

Subsequently, the surface layer of the produced ingot was removed, followed by forging (temperature: 800° C. to 900° C.) to give an ingot having a diameter of 262 mm and a thickness of 50 mm. The ingot was then hot-rolled (temperature: 800° C. to 900° C.) to give a thickness of 12 mm. Furthermore, the ingot was heat-treated (temperature: 800° C. to 900° C.) and was then water-cooled to give a target material. The target material was machined into a target having a diameter of 330 mm and a thickness of 7 mm. The Cr composition, heat treatment temperature, cooling condition, and other data are shown in Table 1. In Comparative Example 2, air-cooling was employed.

The number of precipitated Cr grains in the target of Comparative Example 2 was counted by the procedure shown in FIG. 1. The result is also shown in Table 1. As shown in Table 1, the variation in the number of precipitated Cr grains (difference between the largest and the smallest numbers) was increased to 53. A photograph of the structure of the target surface is shown in FIG. 3, and a polished surface of the target is shown in FIG. 4. It can be observed that the number of Cr grains on the target surface significantly increased compared to those in Examples. In addition, the photograph of the appearance of the surface shows that "unevenness" due to segregation of Cr was caused on the processing surface. Thus, both results were poor.

Subsequently, the film quality of a thin film formed by sputtering was evaluated by forming a thin film with a thickness of 600 nm by sputtering the target of Comparative Example 2 on a 300-mm monocrystalline silicon wafer covered with silicon oxide under the same sputtering conditions as in Example 1 and measuring the number of particles (maximum number) and the sheet resistance levels of the resulting thin film to calculate the uniformity in film thickness. The result is also shown in Table 1. The uniformity was determined by measuring the sheet resistance levels at randomly selected 49 points of the thin film formed on the wafer and calculating from the mean value and the standard deviation by the expression: [(standard deviation of sheet resistance levels at 49 points)/(mean value of the sheet resistance levels at 49 points)×100(%)].

As shown in Table 1, in Comparative Example 2, the number of particles was significantly increased to 113 (maximum number), and the thickness uniformity (film resistance distribution) of the thin film formed using the target was 8.3%. The thickness uniformity was poor.

The analytical data of the target in Comparative Example 2 is shown in Table 2. As obvious from Table 2, a copper-chromium alloy target containing a large amount of impurities was given.

Furthermore, it was confirmed that similar effects can be obtained even if the Cr amount is other than those in Examples 1 and 2 as long as the Cr amount is within the range of 0.1 to 10 wt %.

The present invention provides a high-purity copper-chromium alloy sputtering target and improves the quality of a film formed by sputtering by adding an appropriate amount of a Cr element to copper and reducing the in-plane Cr variation of the sputtering target. In particular, the invention has excellent effects of improving the yield and the reliability of semiconductor products, which have been progressing in miniaturization and integration. In addition, the invention is useful for forming semiconductor copper-chromium alloy wiring having a self-diffusion suppression function, being capable of to effectively preventing the periphery of the wiring from becoming contaminated by diffusion of active Cu, and having excellent, for example, electromigration (EM) resistance and corrosion resistance.

The invention claimed is:

1. A high-purity copper-chromium alloy sputtering target produced from a cast ingot comprising 0.1 to 10 wt % of Cr and the remainder being Cu and inevitable impurities, wherein when the number of precipitated Cr grains in a 100 μm square area is counted at different five areas randomly selected on the surface of the target, the difference between the largest and the smallest numbers of counted precipitated Cr grains is less than 40; the precipitated Cr grains to be counted are grains each having a Cr content of 70% or more and a grain size of 1 to 20 μm.

2. The high-purity copper-chromium alloy sputtering target according to claim 1, wherein the contents of Na and K are each 5 wt ppm or less, the contents of Fe, Al, and Mg are each 1 wt ppm or less, the contents of S and Cl are each 1 wt ppm or less, the contents of C and O are each 10 wt ppm or less, and the contents of U and Th are each 1 wt ppb or less.

3. The high-purity copper-chromium alloy sputtering target according to claim 1, wherein the contents of S and Cl are each 1 wt ppm or less.

4. The high-purity copper-chromium alloy sputtering target according to claim 3, wherein the contents of C and O are each 10 wt ppm or less.

5. The high-purity copper-chromium alloy sputtering target according to claim 3, wherein the contents of U and Th are each 1 wt ppb or less.

6. A high-purity copper-chromium alloy sputtering target produced from a cast ingot comprising 0.1 to 5 wt % of Cr and the remainder being Cu and inevitable impurities, wherein, when a number of precipitated Cr grains having a Cr content of 70% or more and a grain size of 1 to 20 μm in a 100 μm square area is counted at five different areas on a surface of the target, a difference between a largest number and a smallest number of counted precipitated Cr grains is less than 40.

7. The high-purity copper-chromium alloy sputtering target according to claim 6, wherein said target has 5 wt ppm or less of each of Na and K, 1 wt ppm or less of each of Fe, Al, and Mg, 1 wt ppm or less of each of S and Cl, 10 wt ppm or less of each of C and O, and 1 wt ppb or less of each of U and Th.

* * * * *